United States Patent [19]

Valley

[11] Patent Number: 4,675,067

[45] Date of Patent: Jun. 23, 1987

[54] SOLAR CELL COVERSLIDE EXTRACTION APPARATUS

[75] Inventor: Charles R. Valley, Xenia, Ohio

[73] Assignee: The United States of America as represented by the Secretary of the Air Force, Washington, D.C.

[21] Appl. No.: 788,308

[22] Filed: Oct. 17, 1985

Related U.S. Application Data

[62] Division of Ser. No. 620,212, Jun. 13, 1984.

[51] Int. Cl.⁴ .................. B05C 3/04; B08B 13/00; B32B 35/00
[52] U.S. Cl. .................. 156/345; 134/25.4; 134/25.5; 134/36; 134/184; 134/186; 156/98; 156/344; 156/584; 156/630; 156/637
[58] Field of Search .............. 156/345, 630, 637, 668, 156/655, 94, 98, 584, 344; 134/184, 186, 25.4, 25.5, 34, 36, 38

[56] References Cited

U.S. PATENT DOCUMENTS

| | | | |
|---|---|---|---|
| 3,977,926 | 8/1976 | Johnson, Jr. | 156/17 |
| 4,251,317 | 2/1981 | Foote | 156/639 |
| 4,482,425 | 11/1984 | Battey | 156/637 |
| 4,501,636 | 2/1985 | Valley | 156/345 |

Primary Examiner—Donald E. Czaja
Assistant Examiner—Thomas Bokan
Attorney, Agent, or Firm—Bobby D. Scearce; Donald J. Singer

[57] ABSTRACT

Apparatus for extracting a coverslide from a solar cell includes a receptacle defining a cavity in which a rack is disposed which mounts a plurality of partitions in spaced, side-by-side relationship. The partitions define a plurality of extraction chambers therebetween which are open at their opposite ends. A screen is disposed below and underlies the rack for retaining solar cell modules received within the chambers in upright standing positions therein. The cavity is almost filled with a liquid solvent capable of detaching the coverslide of each module from its solar cell. A stirring device disposed below the rack on the bottom of the cavity can be actuated to create flow of the solvent along a circulatory path upwardly through some of the chambers and downwardly through other of the chambers and generally parallel to a plane of attachment of the coverslide to the solar cell of each module in the chambers. Also, air is bubbled through the chambers so as to assist the solvent in detaching the coverslides from the solar cells.

5 Claims, 3 Drawing Figures

U.S. Patent   Jun. 23, 1987   4,675,067
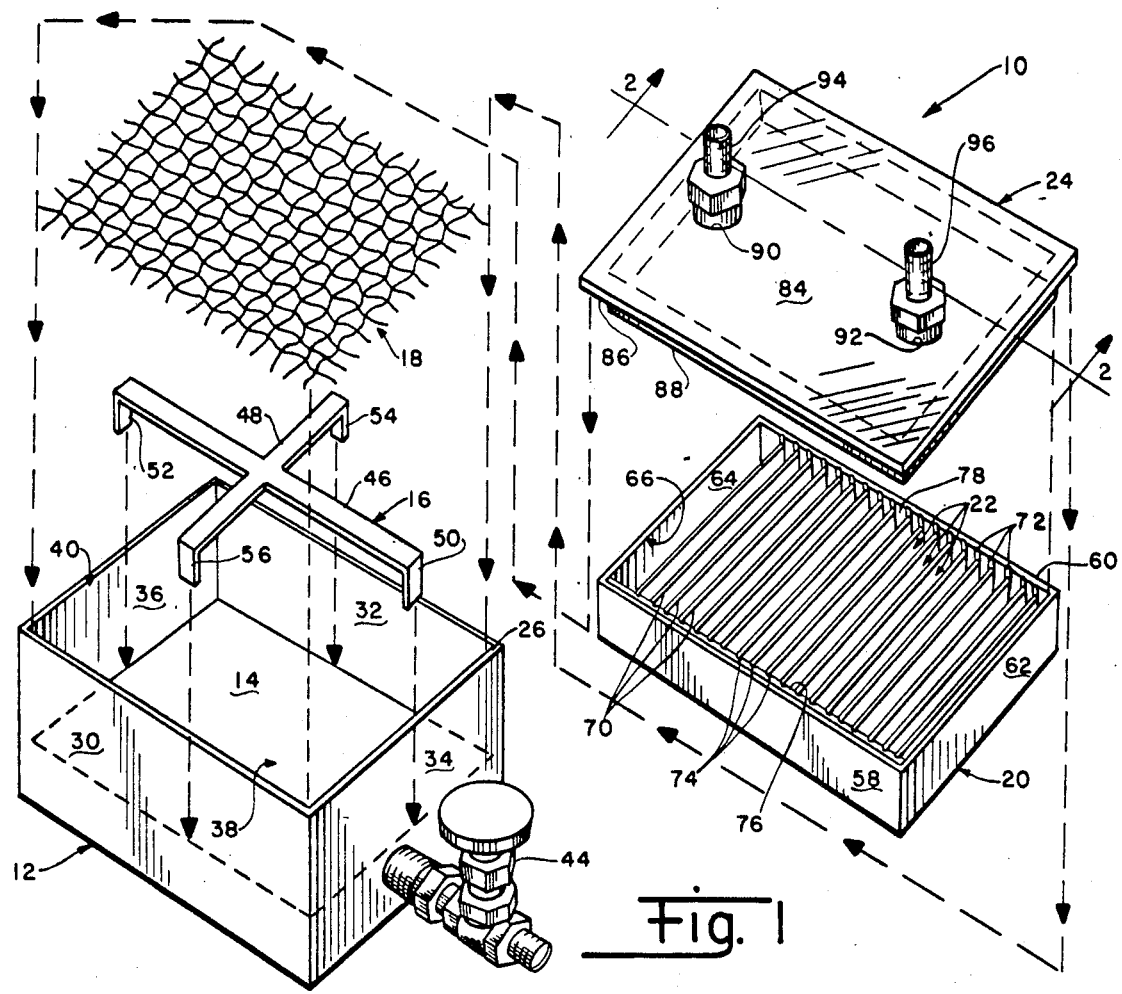
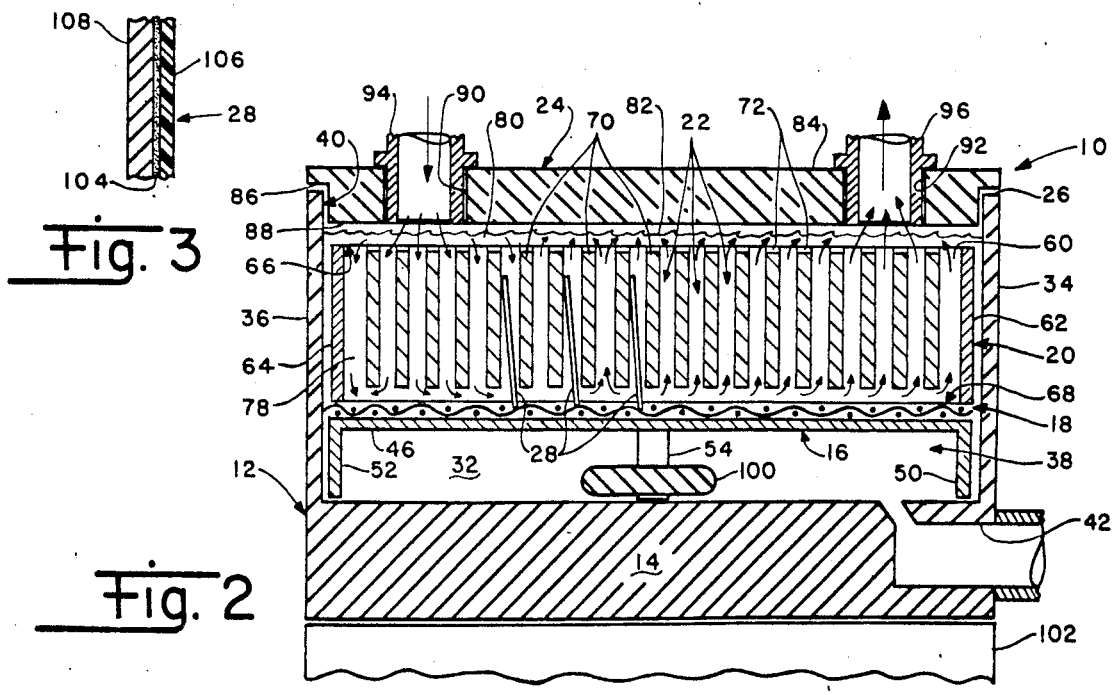

SOLAR CELL COVERSLIDE EXTRACTION APPARATUS

RIGHTS OF THE GOVERNMENT

The invention described herein may be manufactured and used by the Government of the United States for all governmental purposes without the payment of any royalty.

This is a division, of application Ser. No. 620,212, filed 6/13/84.

BACKGROUND OF THE INVENTION

1. Field of the Invention

The present invention broadly relates to solar cell testing and, more particularly, is concerned with a method and apparatus for nondestructive extraction of glued coverslides from solar cell to facilitate testing and evaluation of the solar cells.

2. Description of the Prior Art

Solar cells are typically packaged with a transparent coverslide adhered thereto. The coverslide may be used to serve a variety of purposes: (1) to increase the emissivity of the solar cell and thereby provide a lower operating temperature which raises the electric power output of the cell; (2) to protect the solar cell from radiation damage; and (3) to serve as a substrate for UV or IR reflection filters to decrease operating temperatures and ensure higher cell efficiency.

However, oftentimes in the course of photovoltaic research and development, conditions may necessitate the extraction of the coverslide. For example, requirements for testing solar cells for electrical evaluation, radiation exposure, or thermal shock call for testing groups of uncovered solar cells. At other times, test requirements can call for a specific type of coverslide to be installed on a solar cell previously covered with an inappropriate cover, such as one which varies in optical and physical properties from those that are desired. Also, a fracture may occur in the coverslide of a solar cell prior to or during testing. Due to the large expense of individual cells, it is desirable to be able to remove the damaged coverslide and replace it with a new one.

Heretofore, the technique for coverslide extraction has been rather crude. In this technique, the solar cell with the coverslide adhered thereto are placed in a bottle partially filled with solvent. Then, the jar is gently shaked causing the solvent therein to agitate about the solar cell and initiated loosening of the glue around the edge of the coverslide. Some areas of the coverslide separate quickly from the solar cell while other areas separate more slowly. This uneven separation of the coverslide often rsults in the propagation of stess cracks in the solar cell due to curling thereof which effectively destroys the cell. In other instances, the coverslide cracks and breaks into several parts, one separated from the solar cell and the other still attached thereto. With use of this technique, about 75 percent of the time attempts to extract the coverslide have resulted in cracked coverslides and/or fractured solar cells. In view of the high cost of individual solar cells and the inadequate extraction techniques being used, coverslide extraction has been a bottleneck in certain areas of photovoltaic research and development.

Consequently, a need exists for a reliable coverslide extraction technique which will consistently result in separation of glued coverslides from solar cells without irreversible damage being done to the solar cells.

SUMMARY OF THE INVENTION

The present invention provides a solar cell coverslide extraction method and apparatus designed to satisfy the aforementioned needs. Underlying the present invention is the recognition that part of the problem with the prior technique was that there was a general lack of coordination between the direction of solvent movement and the orientation of the solar cell during agitation of the solvent in the bottle. The sollar cell was lying more or less in a horizontal plane within the bottle of solvent as the solvent was agitated in a more or less stirring motion about it. Before the present invention, no consideration was apparently given to the possibility that coverslide extraction could be improved by proper alignment of the solar cell with the direction of solvent flow.

The unique discovery of the present invention is that support of the solar cell with the plane of attachment of the coverslide to the solar cell substantially parallel to the direction of solvent flow sustantially eliminates the high failure rate experienced in coverslide removal in the past. Up to the present, extraction of coverslides has been fully successful on all solar cells in which the apparatus of the present invention was used. In all cases, coverslides began to separate from the solar cells after only twenty minutes, and complete separation occurred at about one hour.

Accordingly, the present invention is directed to a solar cell coverslide extraction method and apparatus, which employ the operative steps of: (a) defining at least one elongated extraction chamber being open at its opposite ends; (b) supporting a solar cell module within the chamber with the plane of attachment of a coverslide to the solar cell of the module extending generally between one end and an opposite end of the extraction chamber; and (c) flowing a solvent, capable of detaching the coverslide from the solar cell, from one end to the other end of the chamber so as to direct solvent flow between the solar cell and coverslide, as the coverslide separates from the solar cell, in the direction of the plane of attachment of the coverslide to the solar cell.

More particularly, one or more extraction chambers are defined by a rack mounting a plurality of laterally spaced vertical partitions disposed in side-by-side relationship. The plurality of chambers defined between the partitions are adapted to receive one or more solar cell modules therein. The solar cell modules are supported in the chambers by a screen disposed along the bottom of the rack. The screen retains the solar cell modules in upright standing positions within the chambers between the partitions. The rack and screen are supported within a carriage receptacle at a position spaced above the bottom thereof. Flow of solvent contained within the receptacle along a circulatory path upwardly through some of the chambers and downwardly through other of the chambers is caused by a stirring device disposed on the bottom of the receptacle below the rack and screen. Also, air is supplied into and exhausted from the receptacle in a manner which creates air bubbles in the solvent and causes them to propagate down through some of the chambers and up through others and assist the flowing solvent in separating the coverslides from the solar cells.

BRIEF DESCRIPTION OF THE DRAWINGS

FIG. 1 is a perspective view, in exploded form, of the solar cell coverslide extraction apparatus of the present invention.

FIG. 2 is a cross-sectional view of the apparatus, as taken along line 2—2 of FIG. 1, after the apparatus is assembled.

FIG. 3 is a enlarged fragmentary section view of a solar cell module, showing a coverslide attached to a solar cell by a layer of adhesive.

DETAILED DESCRIPTION OF THE PREFERRED EMBODIMENT

Referring now to the drawings, and more particularly to FIGS. 1 and 2, there is shown, in exploded form in FIG. 1 and in assembled form in FIG. 2, the preferred embodiment of the solar cell coverslide extraction apparatus of the present invention, being generally designated 10. The coverslide extraction apparatus 10 includes a carriage receptacle 12 having a base 14, a crossbar support 16 which fits into the receptacle 12 and rests on its base 14, and a screen 18 adapted to rest on top of the support 16. Further, a rack 20 having a plurality of extraction chambers 22 defined therein fits into the receptacle 12 and rests on top of the screen 18. Finally, a lid 24 is adapted to close the receptacle 12 by resting on a top annular edge 26 thereof after one or more solar cell modules 28 have been inserted within the extraction chambers 22.

The carriage receptable 12, casted or machined preferably from aluminum, has the base 14 and two vertical side walls 30,32 interconnected with two vertical end walls 34,36, and all of the walls in turn interconnected with the base 14, to form a rectangular boxlike cavity 38 with an open top 40 above the base 14. A drain tap 42 formed in the base 14 leads into the bottom of the cavity 38 and has a manually-adjustable valve 44 fitted therein.

The crossbar support 16 upon which rests the screen 18, preferably made of interwoven stainless steel wires, has a fore-and-aft bar 46 and a transverse bar 48 with a pair of feet 50, 52 and 54,56 depending from opposite ends of the respective bars 46,48. The support 16 stands on its feet 50-56 on the base 14 of the receptacle 12 at the bottom of the cavity 38.

Within the cavity 38 on top of the screen 18 is fitted the rack 20 which defines the extraction chambers 22. The rack 20 has a rectangular box-like frame concentric in shape with the cavity 38 and comprised by two vertical side walls 58,60 interconnected with two vertical end walls 62,64 which together define open top and bottom 66,68.

The extraction chambers 22 are defined between a plurality of partitions 70 fitted into a corresponding plurality of oppositely facing pairs of vertical slots 72,74 formed in the interior surfaces 76,78 of the side walls 58,60. The slots 72,74 open at the top end 66 of the rack 20 but terminate just short of the bottom 68 thereof so as to support the individual partitions in a horizontal plane just above the open bottom, as clearly seen in FIG. 2. The slots and partitions supported therein are displaced laterally apart one from the next through a distance sufficient to allow easy insertion and withdrawal of the flat, plate-like solar cell modules 28 into and from the elongated, vertically-extending spaces between adjacent partitions 70 which constitute the extraction chambers 22 and have open opposite upper and lower ends. As seen in FIG. 2, when disposed in the chambers 22, the solar cell modules 28 rest on the top of the screen 18 and lean against one of the partitions 70.

With the support 16, screen 18 and rack 20 disposed in the cavity 38 of the carriage receptacle 12 as described above, a solvent liquid 80 is poured in the cavity to a level 82 above the top of the solar cell modules 28 and almost filling the cavity 38. The lid 24 is then placed on the recptacle 12. The lid 24 is in the form of a rectangular solid plate 84 having an annular recessed shoulder 86 extending about the perimeter of the plate. The shoulder is dimensioned to rest on the top annular edge 26 of the receptacle 12 such that a lower central portion 88 of the lid extends into the open top 40 of the receptacle 12 and closes the same.

A pair of spaced pipe taps 90,92 are defined through the lid plate 84 along the lengthwise centerline of the lid. Inserted in the taps 90,92 are respective purging ports 94,96 through which air is supplied and exhausted into and from the cavity 38 via operation of suitable means such as an auxiliary diaphragm pump (not shown). As seen in FIG. 2, air supplied into the cavity 38 through the inlet port 94 creates bubbles therein which are driven downwardly through those of the chambers 22 adjacent the inlet port 94 and then upwardly through those of the chambers 22 located between the ports 94,96 and adjacent to the exhaust port 96. The thin solar cell modules 28 are thus supported on the screen 18 in upright standing positions in an orientation generally parallel to the direction of air bubble and solvent flow through each of the chambers 22 from one end to the opposite end thereof.

In the space 98 created by the presence of the crossbar support 16 placed adjacent the base 14 of the carriage receptacle 12, a device in the form of a magnetic spin stirring prop 100 is provided. The recptacle 12 rests on a variable speed spin prop drive mechanism 102, a commercially-available off-the-shelf component commonly used in chamical laboratories, which is magnetically coupled to the stirring prop 100 to drive the same. The stirring prop 100 spins and stirs the solvent sufficiently to cause flow thereof through a circulation path in which solvent flows upwardly through some of the chambers 22 and downwardly through others of the chambers 22. As the adhesive layer 104 in each solar cell module 28, attaching the coverslide 106 to the solar cell 108 as seen in FIG. 3, begins to dissolve and the coverslide 106 starts to separate from the solar cell 108, the solvent and air bubbles by flowing in the direction of the plane of attachment between the coverslide and solar cell tend to encourage a steadying uniform progression in the separation of the coverslide from the solar cell. Such action discourages uneven separation which otherwise might result in curling and stressing of portions of the coverslide and/or solar cell and possible damage thereof.

It is thought that the present invention and many of its attendant advantages will be understood from the foregoing description and it will be apparent that various changes may be made in the form, construction and arrangement of the parts and steps thereof without departing from the spirit and scope of the invention or sacrificing all of its material advantages, the form hereinbefore described being merely a preferred or exemplary embodiment thereof.

Having thus described the invention, what is claimed is:

1. Apparatus for extracting a coverslide from a solar cell in a solar cell module, said coverslide being adhered to said solar cell by a dissolvable layer of adhesive along a predetermined plane of attachment, said apparatus comprising:

(a) a receptacle having a cavity defined therein;

(b) a rack disposed in said cavity of said receptacle;

(c) a plurality of laterally spaced, generally vertical partitions mounted in said rack in side-by-side relationship, said partitions defining a plurality of chambers therebetween being open at their opposite ends and adapted to receive one or more solar cell modules therein;

(d) retaining means for supporting a plurality of said solar cell modules in a leaning upright standing positions within said chambers with said plane of attachment of said coverslide to said solar cell in each module extending generally between said opposite ends of said respective chambers, whereby the coverslides are free to completely detach from the solar cells;

(e) a liquid solvent filling said cavity to above the level of said solar cell modules received in said chambers, said solvent capable of dissolving the adhesive attaching said coverslide to said solar cell in each module; and (f) means for flowing said solvent within said cavity along respective paths upwardly through some of said chambers and downwardly through other of said chambers, said paths extending from one opposite end through the other opposite end thereof so as to direct solvent flow between said solar cell and coverslide in a module along the plane of attachment of said coverslide to said solar cell to dissolve the layer of adhesive with a steadying uniform progression in the separation of the coverslide from the solar cell.

2. The coverslide extracting apparatus as recited in claim 1, wherein said retaining means is a screen disposed below and underlying said rack in said cavity.

3. The coverslide extracting apparatus as recited in claim 2, further comprising:

(g) means for supporting said screen and rack in spaced relationship above a bottom of said cavity of said receptacle.

4. The coverslide extracting apparatus as recited in claim 3, wherein said solvent flow creating means is a stirring device disposed in said cavity between said bottom thereof and said screen.

5. The coverslide extracting apparatus as recited in claim 1, further comprising:

(g) means for supplying air into and exhausting air from said cavity of said receptacle so as to create air bubbles in said solvent and cause them to propagate down through some of said chambers and up through other of said chambers and thereby assist said flowing solvent in detaching said coverslides from said solar cells in said modules thereof.

* * * * *